US010576912B2

(12) United States Patent
Haraguchi

(10) Patent No.: US 10,576,912 B2
(45) Date of Patent: Mar. 3, 2020

(54) CIRCUIT ASSEMBLY AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Akira Haraguchi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 33 days.

(21) Appl. No.: 15/775,853

(22) PCT Filed: Dec. 7, 2016

(86) PCT No.: PCT/JP2016/086461
§ 371 (c)(1),
(2) Date: May 14, 2018

(87) PCT Pub. No.: WO2017/104518
PCT Pub. Date: Jun. 22, 2017

(65) Prior Publication Data
US 2018/0326924 A1    Nov. 15, 2018

(30) Foreign Application Priority Data

Dec. 16, 2015 (JP) ................................. 2015-244887

(51) Int. Cl.
*B60R 16/02* (2006.01)
*H02G 3/16* (2006.01)
(Continued)

(52) U.S. Cl.
CPC ............... *B60R 16/02* (2013.01); *H01R 4/02* (2013.01); *H02G 3/16* (2013.01); *H05K 1/02* (2013.01); *H05K 7/06* (2013.01)

(58) Field of Classification Search
None
See application file for complete search history.

(56) References Cited

U.S. PATENT DOCUMENTS 3,327,077 A * 6/1967 Morris ............... H01H 36/0006
174/117 F
3,335,327 A * 8/1967 Damon .................. H05K 3/325
174/138 G
(Continued)

FOREIGN PATENT DOCUMENTS

JP    2005-294741 A    10/2005
JP    2006-005107 A    1/2006
JP    2015-139289 A    7/2015

OTHER PUBLICATIONS

Search Report for PCT/JP2016/086461, dated Feb. 21, 2017.

*Primary Examiner* — Timothy J Thompson
*Assistant Examiner* — Muhammed Azam
(74) *Attorney, Agent, or Firm* — Honigman LLP

(57) ABSTRACT

A circuit assembly includes a circuit board having a control circuit controlling the flow of electric current in a power circuit is integrally formed with a top of a plate-shaped busbar. The circuit assembly includes a busbar that is provided with a first through hole, a circuit board in which both surfaces are provided with circuit patterns and that is provided with a second through hole that is aligned with the first through hole, an insulating sheet that is arranged on one side of the circuit board and is interposed between the busbar and the circuit board, and a conductive rivet that is inserted into the first through hole and the second through hole and fixes the circuit board to a top of the busbar. The rivet (Continued)

includes a body inserted into the first through hole and the second through hole, and a head protruding from the circuit board.

4 Claims, 5 Drawing Sheets

(51) Int. Cl.
*H05K 1/02* (2006.01)
*H05K 7/06* (2006.01)
*H01R 4/02* (2006.01)

(56) References Cited

U.S. PATENT DOCUMENTS

| | | | | |
|---|---|---|---|---|
| 3,875,478 A * | 4/1975 | Capstick | H01L 23/48 | 257/774 |
| 3,883,937 A * | 5/1975 | Alexander | H01G 4/30 | 29/25.41 |
| 4,151,479 A * | 4/1979 | Baba | H01L 23/045 | 257/E23.101 |
| RE31,033 E * | 9/1982 | Wilson, Jr. | H02G 3/16 | 439/654 |
| 4,361,371 A * | 11/1982 | Williams | H01R 9/2425 | 361/752 |
| 4,385,791 A * | 5/1983 | Lovrenich | B23K 3/087 | 29/840 |
| 4,387,509 A * | 6/1983 | Dechelette | H02B 1/202 | 140/93 R |
| 4,439,815 A * | 3/1984 | Close | H05K 1/0263 | 361/720 |
| 4,508,399 A * | 4/1985 | Dowling | H01R 12/616 | 439/404 |
| 5,065,283 A * | 11/1991 | Adachi | H05K 1/0263 | 361/775 |
| 5,263,247 A * | 11/1993 | Adachi | F16B 19/10 | 29/525.05 |
| 5,434,749 A * | 7/1995 | Nakayama | H01R 12/62 | 174/261 |
| 5,442,142 A * | 8/1995 | Hayashi | H05K 1/0263 | 174/250 |
| 5,786,982 A * | 7/1998 | Rose | H02B 1/056 | 174/149 B |
| 5,934,930 A * | 8/1999 | Camps | H01R 4/2404 | 439/403 |
| 5,936,849 A * | 8/1999 | Fetterman | G01R 1/0433 | 257/688 |
| 6,184,469 B1 * | 2/2001 | Conti | A63H 19/24 | 174/110 PM |
| 6,696,669 B2 * | 2/2004 | Hembree | H01L 21/50 | 174/536 |
| 7,023,699 B2 * | 4/2006 | Glovatsky | H05K 7/20454 | 165/185 |
| 7,030,322 B2 * | 4/2006 | Preissl | B60K 37/00 | 174/138 R |
| 7,888,601 B2 * | 2/2011 | Bax | H01R 4/30 | 174/252 |
| 8,723,044 B2 * | 5/2014 | Onodi | H02G 3/30 | 174/117 F |
| 8,957,311 B2 * | 2/2015 | Shimada | B60R 16/0215 | 174/169 |
| D767,500 S * | 9/2016 | Byrne | D13/154 | |
| 10,117,322 B2 * | 10/2018 | Chin | H05K 1/0204 | |
| 2010/0141549 A1 * | 6/2010 | Sato | H01Q 1/1207 | 343/872 |
| 2012/0192940 A1 * | 8/2012 | Schulz | H02G 3/16 | 136/256 |
| 2014/0182901 A1 * | 7/2014 | Flaherty | H05K 3/4691 | 174/254 |
| 2016/0044800 A1 * | 2/2016 | Jarvis | H01R 43/205 | 361/759 |
| 2018/0326924 A1 * | 11/2018 | Haraguchi | B60R 16/02 | |

\* cited by examiner

CIRCUIT ASSEMBLY AND ELECTRICAL JUNCTION BOX

CROSS-REFERENCE TO RELATED APPLICATIONS

This application is the U.S. national stage of PCT/JP2016/086461 filed Dec. 7, 2016, which claims priority of Japanese Patent Application No. 2015-244887 filed on Dec. 16, 2015, which are incorporated herein by reference in their entirety.

FIELD OF THE INVENTION

The present disclosure relates to a circuit assembly and an electrical junction box.

BACKGROUND OF THE INVENTION

Conventionally, an electrical junction box (which is also called a power distributor) for distributing power from a power source (battery) to loads such as headlights and windshield wipers is mounted in an automobile. The electrical junction box includes a busbar that is connected to the power source and is part of a power circuit, and a circuit board including a control circuit for controlling the flow of electric current in the power circuit. The control circuit includes a circuit pattern formed on the circuit board, and electronic components such as switching elements (e.g., relays and FETs (field effect transistors)) and control elements (e.g., microcomputers and control ICs (integrated circuits).

In recent years, in order to reduce the size of the electrical junction box, circuit assemblies in which a circuit board is arranged integrally with the top of a busbar have been developed. As an example, JP 2005-117719A discloses a circuit assembly manufactured by using an adhesive sheet to bond the busbar and the circuit board together. In some cases, the control circuit provided on the circuit board needs to be electrically connected directly to the busbar in the circuit assembly as shown in JP 2005-224053A. JP 2005-224053A proposes a connection method in which a connection chip is used as an intermediary. Specifically, JP 2005-224053A discloses a circuit assembly in which a conductive pad is provided on one side of the circuit board, a through hole through which the busbar is exposed is formed at a position adjacent to the conductive pad. A connection chip having a shape spanning the through hole and the conductive pad is soldered to both the busbar and the conductive pad. In the circuit assembly disclosed in JP 2005-224053A, the busbar and the conductive pad are electrically connected to each other via the connection chip.

SUMMARY OF THE INVENTION

A circuit assembly of the present disclosure is a circuit assembly in which a circuit board including a control circuit for controlling a flow of electric current in a power circuit is arranged integrally with a top of a plate-shaped busbar that is part of the power circuit, the circuit assembly including: a busbar that is provided with a first through hole; a circuit board in which both sides are provided with circuit patterns and that is provided with a second through hole that is aligned with the first through hole; an insulating sheet that is arranged on one side of the circuit board and is interposed between the busbar and the circuit board; and a conductive rivet that is inserted into the first through hole and the second through hole and fixes the circuit board to a top of the busbar, wherein the rivet includes a body inserted into the first through hole and the second through hole, and a head protruding from the circuit board.

An electrical junction box of the present disclosure includes: the above-mentioned circuit assembly of the present disclosure; a heat sink attached to the busbar; and a case accommodating the circuit assembly and the heat sink.

In general, in a conventional circuit assembly, the busbar and the circuit board are bonded together by stacking the busbar and the circuit board with an adhesive sheet in which thermosetting epoxy-based adhesive has been applied to both sides of a substrate made of a polyimide film being sandwiched therebetween, and performing thermocompression bonding using a hot pressing apparatus.

In the conventional circuit assembly, the circuit board is fixed to the top of the busbar by using the adhesive sheet to bond the busbar and the circuit board together, and therefore, there are cases where the circuit board moves during thermocompression bonding and cannot be thus fixed at a predetermined position. In the conventional connection method in which a connection chip is used as an intermediary, the connection chip as well as the electronic components installed on the circuit board is reflow-soldered at the same time. However, there are cases where the connection chip moves while solder is melted, and is thus not soldered at a predetermined position. Therefore, in the worst case, there is a risk that the busbar and the control circuit provided on the circuit board cannot be electrically connected via the connection chip.

Accordingly, the conventional circuit assembly has room for improvement in terms of productivity.

Therefore, an object of the present disclosure is to provide a circuit assembly that is superior in terms of productivity. In addition, another object of the present disclosure is to provide an electrical junction box including this circuit assembly.

The circuit assembly and the electrical junction box of the present disclosure are superior in terms of productivity.

DETAILED DESCRIPTION OF THE PREFERRED EMBODIMENTS

Figure 1:
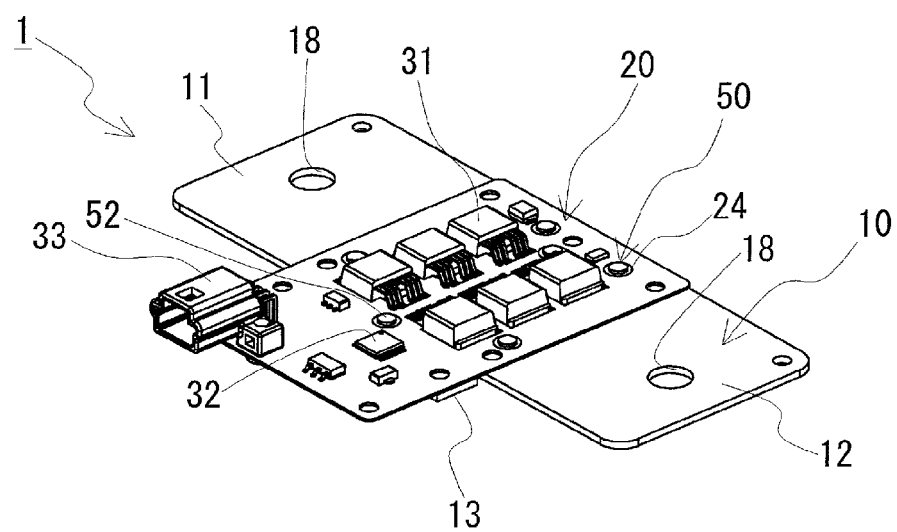
FIG. 1 is a schematic perspective view of a circuit assembly according to Embodiment 1.

The inventors of the present disclosure propose that in order to position the circuit board on the top of the busbar and fix it thereto, through holes that are aligned with each other are formed in the busbar and the circuit board, and a conductive rivet is inserted into these through holes to fix the circuit board. First, embodiments of the present disclosure will be listed and described.

(1) A circuit assembly according to an aspect of the present disclosure is a circuit assembly in which a circuit board including a control circuit for controlling a flow of electric current in a power circuit is arranged integrally with a top of a plate-shaped busbar that is part of the power circuit, the circuit assembly including: a busbar that is provided with a first through hole; a circuit board in which both sides are provided with circuit patterns and that is provided with a second through hole that is aligned with the first through hole; an insulating sheet that is arranged on one side of the circuit board and is interposed between the busbar and the circuit board; and a conductive rivet that is inserted into the first through hole and the second through hole and fixes the circuit board to a top of the busbar, wherein the rivet includes a body inserted into the first through hole and the second through hole, and a head protruding from the circuit board.

With the above-mentioned circuit assembly, the first and second through holes that are aligned with each other are respectively formed in the busbar and the circuit board, and the busbar and the circuit board are positioned with respect to each other and mechanically joined to each other by inserting the conductive rivet into these through holes. That is, the rivet can be used to position and fix the busbar and the circuit board. Therefore, the positional shifts between the busbar and the circuit board during the fixation of the circuit board to the top of the busbar can be suppressed, and the above-mentioned circuit assembly is thus superior in terms of productivity. The rivet is conductive, and therefore, the busbar and the control circuit of the circuit board can be electrically connected to each other via the rivet. Specifically, an end of the body of the rivet inserted into the first through hole is fixed to the busbar, and the busbar and the rivet are thus electrically connected to each other. Then, the circuit pattern and the electronic components included in the control circuit are electrically connected to the head of the rivet protruding from the circuit board through soldering or the like, and the busbar and the control circuit are thus electrically connected to each other via the rivet. Accordingly, in the above-mentioned circuit assembly, the rivet inserted into the first and second through holes that are aligned with each other has not only a function of positioning and fixing the busbar and the circuit board but also a function of electrically connecting the busbar and the control circuit.

With the above-mentioned circuit assembly, the circuit board is fixed to the busbar by using the rivet to mechanically join the busbar and the circuit board. Therefore, unlike the conventional circuit assembly, it is not necessary to bond the busbar and the circuit board together through thermocompression bonding using a thermosetting adhesive (e.g., epoxy-based adhesive). Accordingly, the thermocompression bonding can be omitted, and thus the manufacturing time can be reduced. In addition, an apparatus such as the hot pressing apparatus is also not required, thus making it possible to reduce production cost. Furthermore, since the thermocompression bonding is not performed, the deformation of the circuit board and cracks in the solder resulting from residual stress caused by repeated heating and cooling can be prevented, thus improving the reliability.

(2) In an embodiment of the above-mentioned circuit assembly, a land is provided around an opening of the second through hole on the other side of the circuit board, and the head of the rivet and the land are electrically connected.

Since the land is provided around the opening of the second through hole on the other side of the circuit board on which the circuit pattern is formed, it is easy to electrically connect the head of the rivet to the land and fix it thereto through soldering.

(3) In an embodiment of the above-mentioned circuit assembly, a plurality of the first through holes and a plurality of the second through holes are formed, and a plurality of the rivets inserted to the first through holes and the second through holes are provided.

A plurality of the first through holes and a plurality of the second through holes are formed in the busbar and the circuit board, and a plurality of the rivet are inserted into the through holes, thus making it possible to restrain the movement of the circuit board with respect to the busbar and suppress the positional shifts between the busbar and the circuit board more effectively. Accordingly, with the above-mentioned embodiment, improved accurate positioning of the busbar and the circuit board is achieved.

(4) An electrical junction box according to an aspect of the present disclosure includes: the circuit assembly according to any one of (1) to (3) above; a heat sink attached to the busbar; and a case accommodating the circuit assembly and the heat sink.

The above-mentioned electrical junction box includes the above-mentioned circuit assembly according to an aspect of the present disclosure and is thus superior in terms of productivity. Moreover, in the above-mentioned electrical junction box, the heat sink is attached to the busbar of the circuit assembly, and therefore, heat generated in the circuit assembly can be dissipated to the heat sink, and the high reliability is achieved.

DETAILS OF EMBODIMENTS OF THE PRESENT DISCLOSURE

Hereinafter, specific examples of the circuit assembly and the electrical junction box according to embodiments of the present disclosure will be described with reference to the drawings. In the figures, components having the same name are denoted by the same reference numeral. It should be noted that the present disclosure is not limited to these embodiments and is defined by the scope of the appended claims, and all changes that fall within the same essential spirit as the scope of the claims are intended to be included therein.

Embodiment 1

Circuit Assembly

Figure 2:
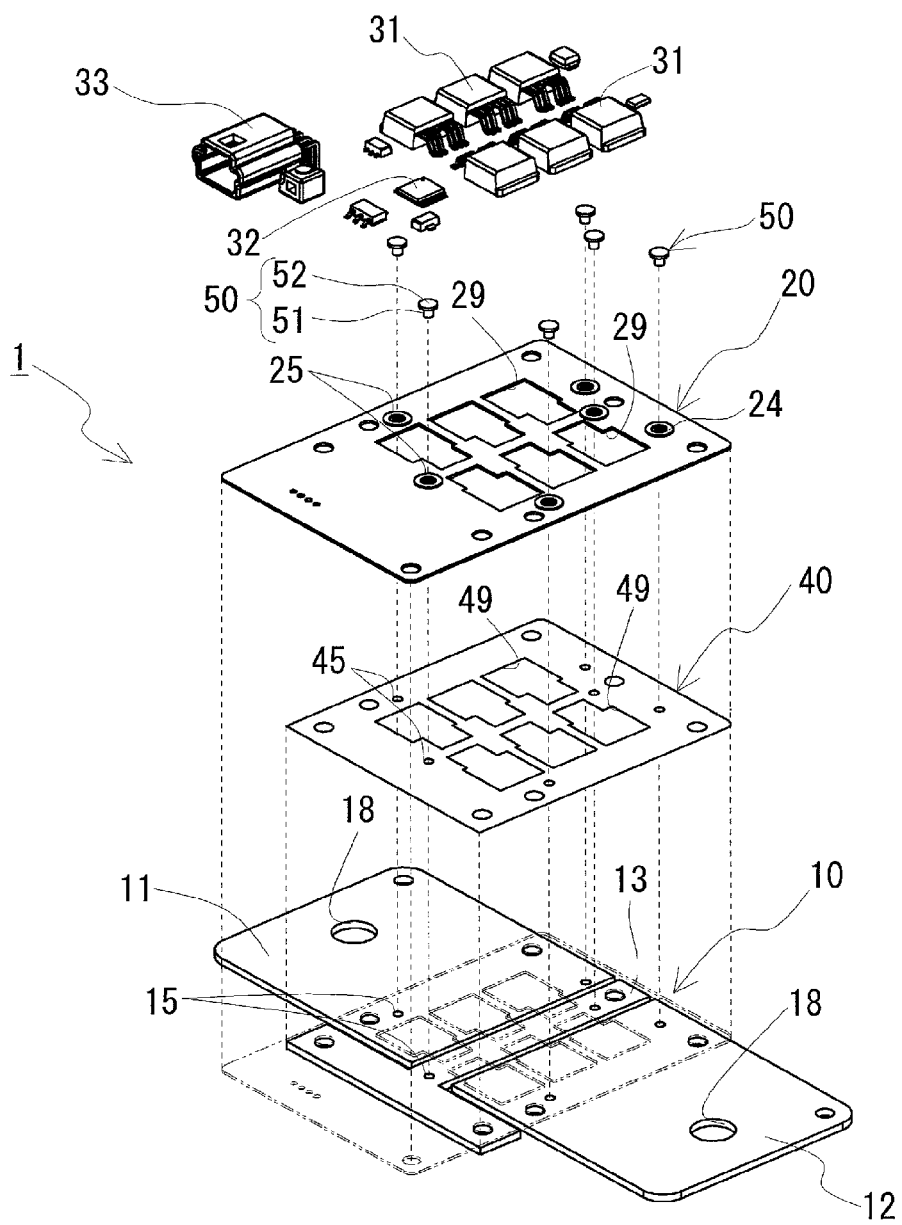
FIG. 2 is a schematic exploded perspective view of the circuit assembly according to Embodiment 1.
Figure 3:
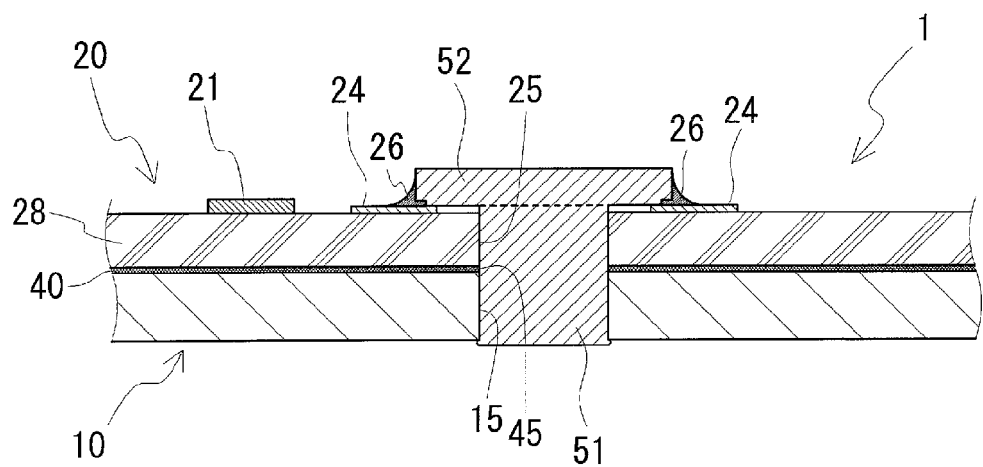
FIG. 3 is a schematic longitudinal cross-sectional view showing a relevant portion of the circuit assembly according to Embodiment 1.

A circuit assembly of Embodiment 1 will be described with reference to FIGS. 1 to 4. As shown in FIGS. 1 to 3, a circuit assembly 1 of Embodiment 1 includes a plate-shaped busbar 10 and a circuit board 20. The circuit board 20 is arranged integrally with the top of the busbar 10. One feature of the circuit assembly 1 of Embodiment 1 is that, as shown in FIGS. 2 and 3, first through holes 15 and second through holes 25 that are aligned with each other are respectively formed in the busbar 10 and the circuit board 20, and conductive rivets 50 inserted into these through holes 15 and 25 are provided. Hereinafter, the configuration of the circuit assembly 1 will be described in detail. In the following description, in the circuit assembly 1, the circuit board 20 side is referred to as "upper side", and the busbar 10 side is referred to as "lower side".

Busbar

The busbar 10 is a plate-shaped component that is part of a power circuit. In this embodiment, as shown in FIG. 2, the busbar 10 includes a plurality of busbar pieces 11 to 13, and the busbar pieces 11 to 13 are arranged in a predetermined layout on the same plane. The busbar 10 (busbar pieces 11 to 13) is made of a conductive metal plate. Specifically, the busbar 10 is formed by cutting a plate material made of copper into a predetermined shape. The size of the busbar 10 (busbar pieces 11 to 13) is set to be suitable for an electric current flow amount and heat dissipation, and the thickness thereof is set to about 0.5 to 1.0 mm, for example. A wire harness 90 (see FIG. 5) is electrically connected to the busbar 10 as described later. In this embodiment, terminal insertion holes 18 into which power source terminals 85 (see FIGS. 5 and 6), which will be described later, can be inserted are formed in the busbar pieces 11 and 12, and the busbar pieces 11 and 12 are electrically connected to the wire harnesses 90 via the power source terminals 85.

First Through Hole

As shown in FIGS. 2 and 3, the first through holes (referred to as "rivet insertion holes" hereinafter) 15 into which the rivets 50, which will be described later, are to be inserted are formed in the busbar 10. In this embodiment, a plurality of rivet insertion holes 15 are formed in the busbar 10.

Circuit Board

As shown in FIGS. 1 to 3, the circuit board 20 is arranged on the busbar 10, and includes a control circuit for controlling the flow of electric current in the power circuit. Circuit patterns 21 (see FIG. 3) are formed on both sides (i.e., upper side and lower side) of the circuit board 20. In FIG. 3, only the circuit pattern 21 on the upper side (one side opposite to the side on which the busbar 10 is arranged) of the circuit board 20 is shown, and the circuit pattern on the lower side (the other side on which the busbar 10 is arranged) is omitted (the same applies to FIG. 4). Specifically, the circuit board 20 is a printed circuit board obtained by printing the circuit patterns 21 on an insulated board 28, and the circuit patterns 21 are made of a copper foil. An exterior electronic control unit (not shown) is to be connected to the circuit board 20.

As shown in FIG. 1, part of the terminals of FETs 31 and electronic components such as a microcomputer 32 and a control connector 33 are installed on the circuit board 20 through soldering. The microcomputer 32 is a control element for controlling the FETs 31 and the like. The control connector 33 is a connector to which an electronic control unit can be connected, and the electronic components operate based on the control signals from the electronic control unit. The control circuit is constituted by the circuit patterns 21 formed on the circuit board 20, and the electronic components installed on the circuit board 20.

In this embodiment, another part of the terminals of FETs 31 is directly joined to the top of the busbar 10 through soldering. Therefore, as shown in FIG. 2, component openings 29 corresponding to the FETs 31 are formed at portions of the circuit board 20 at which the FETs 31 are to be arranged.

Second Through Hole

As shown in FIGS. 2 and 3, the second through holes (referred to as "rivet insertion holes" hereinafter) 25 that are aligned with the rivet insertion holes 15 in the busbar 10 and into which the rivets 50, which will be described later, are inserted are formed in the circuit board 20. Specifically, the rivet insertion holes 15 and 25 are located at the same positions and are aligned with each other when the busbar 10 and the circuit board 20 are stacked, and the rivets 50 are inserted into the rivet insertion holes 15 and 25 that are aligned with each other. In this embodiment, a plurality of rivet insertion holes 25 are formed in the circuit board 20, in correspondence with the rivet insertion holes 15 in the busbar 10.

Land

A land 24 is formed around the opening of each rivet insertion hole 25 on the upper side (one side opposite to the side on which the busbar 10 is arranged) of the circuit board 20. A head 52 of the rivet 50 is joined to the land 24 through soldering, and is thus electrically connected thereto. The land 24 is electrically connected to the circuit pattern 21 formed on the circuit board 20, and is electrically connected to the busbar 10 via the rivet 50.

Insulating Sheet

As shown in FIGS. 2 and 3, an insulating sheet 40 that is interposed between the busbar 10 and the circuit board 20 is arranged on the lower side (the other side on which the busbar 10 is arranged) of the circuit board 20. With this insulating sheet 40, electric insulation is ensured between the busbar 10 and the circuit board 20.

The insulating sheet 40 is made of an insulating material, and has a heat resistance against a solder reflow temperature during the installation of the electronic components. Examples of the insulating sheet 40 include nonwoven fabrics containing cellulose fibers, nonwoven fabrics containing resin fibers, nonwoven fabrics containing glass fibers, resin sheets made of polyimide, and resin sheets made of polyamideimide. The thickness of the insulating sheet 40 is set to 25 µm or more and 100 µm or less, for example, in order to ensure the electric insulation between the busbar 10 and the circuit board 20.

As shown in FIGS. 2 and 3, third through holes (referred to as "rivet insertion holes" hereinafter) 45 that are aligned with the rivet insertion holes 15 in the busbar 10 and the rivet insertion holes 25 in the circuit board 20, and into which the rivets 50, which will be described later, are to be inserted are formed in the insulating sheet 40. Specifically, the rivet insertion holes 15, 25, and 45 are located at the same positions and are aligned with each other when the busbar 10, insulating sheet 40, and the circuit board 20 are stacked, and the rivets 50 are inserted into the rivet insertion holes 15, 25, and 45 that are aligned with each other. In this embodiment, a plurality of rivet insertion holes 45 are also formed in the insulating sheet 40, in correspondence with the rivet insertion holes 15 in the busbar 10 and the rivet insertion holes 25 in the circuit board 20. Moreover, in the insulating sheet 40, component openings 49 corresponding to the FETs 31 are formed at the same positions as those of the component openings 29 in the circuit board 20.

Rivet

The rivet 50 is a conductive component that is inserted into the rivet insertion holes 15 and 25 that are aligned with each other as shown in FIGS. 2 and 3 to fix the circuit board 20 to the top of the busbar 10. The rivet 50 is made of a conductive metal material such as aluminum or copper, and includes a body 51 that is inserted into the rivet insertion holes 15 and 25, and a head 52 that will protrude from the circuit board 20. In this embodiment, the rivet 50 is made of copper, and its surface is plated with nickel. A plurality of the rivets 50 are provided in correspondence with the rivet insertion holes 15 and 25, and the rivets 50 are inserted into the rivet insertion holes 15 and 25 that are aligned with each other.

Figure 4:
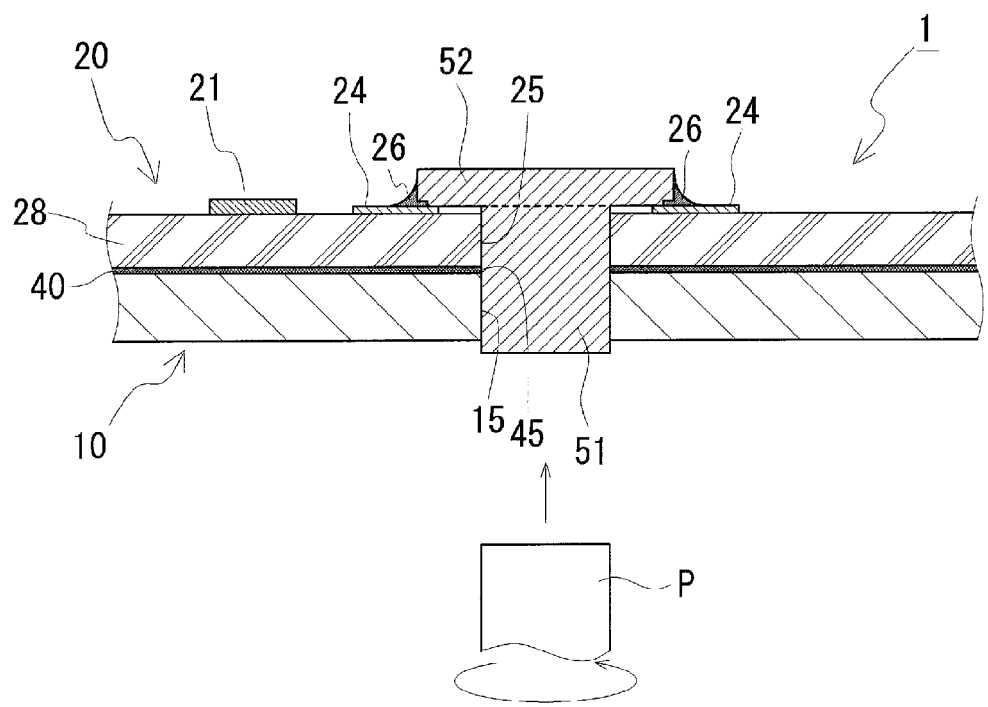
FIG. 4 is a schematic longitudinal cross-sectional view illustrating a method for crimping a rivet.

The leading end (an end on a side opposite to the head 52 side) of the body 51 is crimped and plastically deformed in a state in which the rivet 50 is inserted into the rivet insertion holes 15 and 25, and the rivet 50 is thus fixed to the busbar 10. Accordingly, the busbar 10 and the circuit board 20 are joined to each other with the rivets 50, and the rivets 50 are electrically connected to the busbar 10. In this embodiment, as shown in FIG. 4, the end of the body 51 is fixed by pushing a rotating punch P against the surface at the leading end of the body 51 inserted into the rivet insertion holes 15 and 25, and deforming the leading end of the body 51 through pressure application such that the leading end is spread out in a radial direction, that is, by so-called "spinning crimping".

The head 52 of the rivet 50 is soldered to the land 24, which is formed around the opening of the rivet insertion hole 25 formed in the circuit board 20, and the head 52 of the rivet 50 and the land 24 are electrically connected to each other with solder 26. Therefore, the busbar 10 and the land 24 formed on the circuit board 20 are electrically connected to each other via the rivets 50, and the busbar 10 and the control circuit of the circuit board 20 are thus electrically connected to each other.

Method for Manufacturing Circuit Assembly

An example of a procedure for manufacturing the circuit assembly 1 of Embodiment 1 shown in FIG. 1 will be described with reference to FIGS. 2 to 4.

(1) The busbar 10, the circuit board 20, the insulating sheet 40, and the rivets 50 are prepared (see FIG. 2). The busbar 10 is produced by cutting a plate material made of oxygen-free copper into a predetermined shape. Specifically, the busbar 10 in which the busbar pieces 11 to 13 that each have a predetermined shape are arranged as shown in FIG. 2 is produced by punching a plate material made of oxygen-free copper. The rivet insertion holes 15 are formed at predetermined positions in the busbar 10.

The circuit board 20 is produced as follows. A board material is prepared that has been processed into a predetermined shape by forming the component openings 29 (see FIG. 2) and the like at predetermined positions in a copper-clad laminate in which copper foils are laminated on both sides of the insulated board 28 (see FIG. 3). Moreover, as shown in FIG. 2, the rivet insertion holes 25 to be brought into alignment with the rivet insertion holes 15 in the busbar 10 are formed at predetermined positions in this board material. Then, as shown in FIG. 3, the circuit patterns 21 (only one of them is shown) are formed on both sides by etching the copper foils, and the lands 24 are formed around the openings on the upper side of the rivet insertion holes 25. The circuit board 20 is thus produced.

The insulating sheet 40 is produced by cutting an electrically insulating polyimide film into a predetermined shape as shown in FIG. 2. The rivet insertion holes 45 and the component openings 49 are formed at predetermined positions in the insulating sheet 40.

(2) The busbar 10 and the circuit board 20 are joined to each other with the rivets 50, and the circuit board 20 is thus fixed to the top of the busbar 10 (see FIG. 2). Specifically, as shown in FIG. 2, the busbar 10 and the circuit board 20 are stacked with the insulating sheet 40 being sandwiched therebetween, and the rivets 50 are inserted into the rivet insertion holes 15, 25, and 45 that are aligned with each other. At this time, the rivets 50 are inserted thereinto from the circuit board 20 side, and, as shown in FIG. 3, the heads 52 of the rivets 50 are located on the lands 24. Thereafter, as shown in FIG. 4, a rotating punch P is pushed against the surface at the leading end of the rivet 50 protruding from the opening of the rivet insertion hole 15, and then the leading end of the body 51 is crimped through spinning crimping. Accordingly the leading end of the body 51 is deformed through pressure application, and the end of the body 51 is thus joined to the busbar 10. As a result, the busbar 10 and the circuit board 20 are integrated.

(3) After the busbar 10 and the circuit board 20 are integrated, the electronic components are installed on the circuit board 20 (see FIG. 2). Specifically, solder paste is printed at the positions on the circuit board 20 at which the electronic components (e.g., FETs 31) are to be installed, and the lands 24, and then the electronic components are placed. Thereafter, in a reflow furnace, the electronic components are joined to the top of the circuit board 20 through soldering, and the heads 52 of the rivets 50 are joined to the lands 24 through soldering as shown in FIG. 3. In this embodiment, the electronic components are also installed on the busbar 10, and therefore, solder paste is also printed on the busbar 10. The circuit assembly 1 shown in FIG. 1 is obtained through these steps.

Functions and Effects of Circuit Assembly

The circuit assembly 1 of Embodiment 1 exhibits the following effects.

(1) With the circuit assembly 1, the rivets insertion holes 15 and 25 that are aligned with each other are formed in the busbar 10 and the circuit board 20, and the busbar 10 and the circuit board 20 are positioned with respect to each other and mechanically joined to each other with the rivets 50 inserted into the rivet insertion holes 15 and 25. That is, the rivets 50 can be used to position and fix the busbar 10 and the circuit board 20, and therefore, the positional shifts between the busbar 10 and the circuit board 20 can be suppressed. The rivets 50 are conductive, and thus the busbar 10 and the control circuit of the circuit board 20 can be electrically connected to each other via the rivets 50. Accordingly, the rivets 50 inserted into the rivet insertion holes 15 and 25 have not only a function of positioning and fixing the busbar 10 and the circuit board 20 but also a function of electrically connecting the busbar 10 and the control circuit of the circuit board 20, and the circuit assembly 1 is thus superior in terms of productivity.

(2) With the circuit assembly 1, the circuit board 20 is fixed to and integrated with the busbar 10 by using the rivets 50 to mechanically join the busbar 10 and the circuit board 20. Therefore, unlike a conventional circuit assembly, it is not necessary to bond the busbar and the circuit board together through thermocompression bonding using a thermosetting adhesive (e.g., epoxy-based adhesive). Accordingly, with the circuit assembly 1, compared with a conventional circuit assembly, the thermocompression bonding can be omitted, and thus the manufacturing time can be reduced. In addition, an apparatus such as a hot pressing apparatus is also not required. Therefore, the productivity can be improved, and the manufacturing apparatuses can be simplified. The circuit assembly 1 is thus inexpensive and superior in terms of productivity. Furthermore, the deformation of the circuit board 20 and cracks in the solder resulting from residual stress caused by themocompression bonding can be prevented, thus improving the reliability.

(3) Since the lands 24 are provided around the openings of the rivet insertion holes 25, it is easy to electrically connect and fix the heads 52 of the rivets 50 to the lands 24 through soldering.

(4) A plurality of the rivet insertion holes 15 and a plurality of the rivet insertion holes 25 are respectively formed in the busbar 10 and the circuit board 20, and the rivets 50 are inserted into the rivet insertion holes 15 and 25 that are aligned with each other, thus making it possible to more effectively suppress the positional shifts between the busbar 10 and the circuit board 20. Accordingly, improved accurate positioning of the busbar 10 and the circuit board 20 is achieved.

(5) The rivet insertion holes 45 are also formed in the insulating sheet 40 interposed between the busbar 10 and the circuit board 20, and the insulating sheet 40 is also positioned by inserting the rivets 50 into the rivet insertion holes 45.

Modified Example 1

A adhesive that has adhesiveness at room temperature may be applied to both sides of the insulating sheet 40. With this configuration, the busbar 10 and the circuit board 20 can be bonded to the insulating sheet 40 and temporarily fixed thereto. Therefore, when the rivet 50 is inserted into the rivet insertion holes 15 and 25, and the end of the body 51 is crimped, the busbar 10 and the circuit board 20, which have been stacked, do not separate, thus facilitating the operation.

The adhesive is required to have a heat resistance against a solder reflow temperature and electrical insulating properties. Examples of the adhesive that has adhesiveness at room temperature include an acrylic adhesive, a silicone-based adhesive, and a urethane-based adhesive. Of these, the acrylic adhesive containing an acrylic polymer is practical because it is very adhesive, has excellent shelf life due to the capability of being stored at room temperature, and is inexpensive. In contrast, a conventionally used epoxy-based adhesive is easy to deteriorate and needs to be stored at a low temperature, for example, and is thus inferior in terms of shelf life and is difficult to store and handle.

When a thermosetting adhesive such as the epoxy-based adhesive is used, it is necessary to subject the busbar 10 and the circuit board 20 to thermocompression bonding. In contrast, when a adhesive that has adhesiveness at room temperature is used, the busbar 10 and the circuit board 20 can be bonded together at room temperature without performing thermocompression bonding, thus making it easy to temporarily fix the circuit board 20 to the busbar 10. Therefore, when either an adhesive or a adhesive is applied to both sides of the insulating sheet 40, the adhesive is advantageous in terms of the productivity.

Electrical Junction Box

Figure 5:
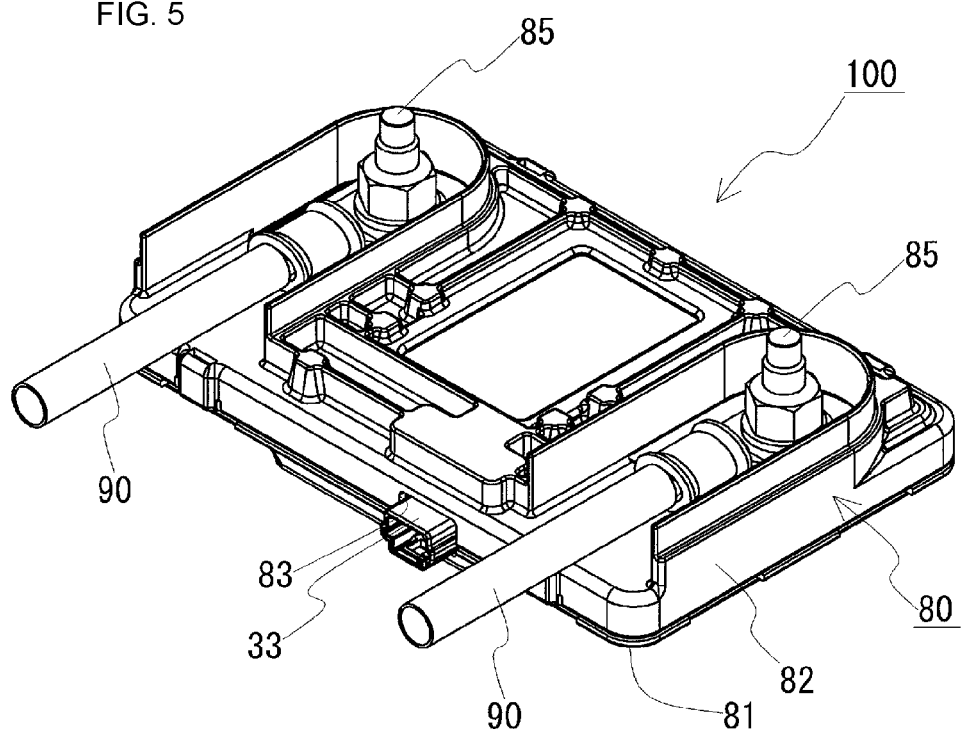
FIG. 5 is a schematic perspective view of an electrical junction box according to Embodiment 1.
Figure 6:
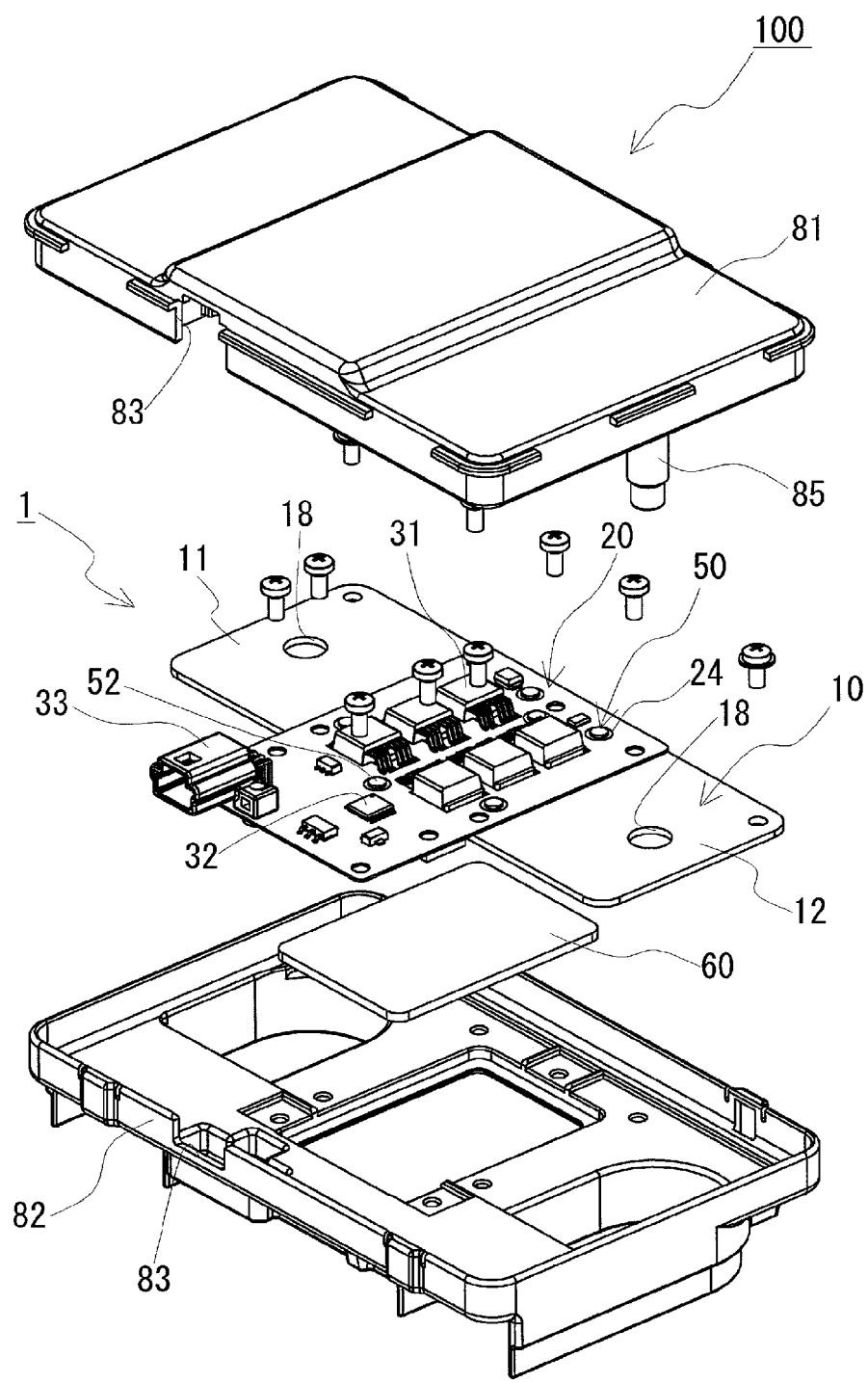
FIG. 6 is a schematic exploded perspective view of the electrical junction box according to Embodiment 1.

Next, an electrical junction box 100 of Embodiment 1 will be described with reference to FIGS. 5 and 6. As shown in FIG. 6, the electrical junction box 100 of Embodiment 1 includes the circuit assembly 1, a heat sink 60, and a case 80. FIG. 5 is a diagram of the electrical junction box 100 as viewed from the lower side, and is inverted in the vertical direction compared with FIG. 6. Hereinafter, the configuration of the electrical junction box 100 will be described in detail. It should be noted that the circuit assembly 1 shown in FIG. 6 is the same as the above-described circuit assembly 1 of Embodiment 1 shown in FIG. 1, and identical constituents are denoted by identical reference numerals and the description thereof is omitted.

The heat sink 60 is attached to the busbar 10 of the circuit assembly 1. The heat sink 60 is made of a highly heat-conductive metal material such as aluminum or copper. In this embodiment, the heat sink 60 is an aluminum plate. There is no particular limitation on the shape of the heat sink 60, and the heat sink 60 may have a plate shape or a block shape. The heat sink 60 mainly serves to prevent the temperatures of the electronic components (e.g., FETs 31) installed in the circuit assembly 1 and the temperature of the solder for installing the electronic components from exceeding the acceptable temperatures. The size of the heat sink 60 is set to be suitable for heat dissipation, for example.

The heat sink 60 is attached to the circuit assembly 1 (busbar 10) through bonding using an adhesive, an adhesive sheet in which an adhesive has been applied to both sides of a substrate, or a adhesive sheet in which a adhesive that has adhesiveness at room temperature has been applied to both sides of a substrate, for example. An example of the adhesive is an epoxy-based adhesive, and examples of the adhesive include an acrylic adhesive, a silicone-based adhesive, and a urethane-based adhesive. Examples of the substrate for the adhesive sheet or the adhesive sheet include the same materials as used for the insulating sheet 40 (see FIG. 2) of the above-described circuit assembly 1, and specific examples thereof include electrically insulating nonwoven fabrics and resin sheets. When the adhesive sheet is used, it is not necessary to perform thermocompression bonding, and therefore, the production cost can be reduced, which is advantageous in terms of the productivity.

The case 80 accommodates the circuit assembly 1 and the heat sink 60. In this embodiment, as shown in FIG. 6, the case 80 includes an upper case 81 and a lower case 82. Rod-shaped power source terminals 85 extending toward the lower case 82 are provided inside the upper case 81. The power source terminals 85 are inserted into the terminal insertion holes 18 formed in the busbar 10 (busbar pieces 11 and 12) of the circuit assembly 1, and are electrically connected to the busbar 10. As shown in FIG. 5, the power source terminals 85 protrude from the case 80 to the outside via through holes formed in the lower case 82, and the wire harnesses 90 are attached to the ends of the power source terminals 85 protruding from the case 80 to the outside. As a result, the busbar 10 is electrically connected to the wire harnesses 90 via the power source terminals 85. A connector opening 83 is formed in the case 80 such that the control connector 33 of the circuit assembly 1 is exposed from the case 80 to the outside.

Method for Manufacturing Electrical Junction Box

An example of a procedure for manufacturing the electrical junction box 100 of Embodiment 1 shown in FIG. 5 will be described with reference to FIG. 6.

After the heat sink 60 is bonded to the lower side of the busbar 10 of the circuit assembly 1, the circuit assembly 1 is attached and fixed to the inside of the lower case 82 using screws. Then, the case 80 is assembled by fitting the upper case 81 to the lower case 82. The electrical junction box 100 shown in FIG. 5 is thus obtained.

Applications of Circuit Assembly and Electrical Junction Box

The circuit assembly and the electrical junction box according to the embodiment of the present disclosure can be favorably used in an electrical junction box for an automobile.

LIST OF REFERENCE NUMERALS

1 Circuit assembly
100 Electrical junction box
10 Busbar
11 to 13 Busbar piece
15 First through hole (rivet insertion hole)
18 Terminal insertion hole
20 Circuit board
21 Circuit pattern
24 Land
25 Second through hole (rivet insertion hole)
26 Solder 28 Insulated board
29 Component opening
31 FET
32 Microcomputer
33 control connector
40 Insulating sheet
45 Third through hole (rivet insertion hole)
49 Component opening
50 Rivet
51 Body
52 Head
60 Heat sink
80 Case
81 Upper case
82 Lower case
83 Connector opening
85 Power source terminal
90 Wire harness
P punch

The invention claimed is:

1. A circuit assembly for controlling a flow of electric current in a power circuit, the circuit assembly comprising:
a busbar including at least one first through hole;
a circuit board having a circuit pattern on each side of the circuit board, the circuit board having at least one second through hole that is aligned with the at least one first through hole;
an insulating sheet interposed between the busbar and the circuit board; and
a conductive rivet that is inserted into the at least one first through hole and the at least one second through hole and fixes the circuit board to a top of the busbar,
wherein the rivet includes a body inserted into the at least one first through hole and the at least one second through hole, wherein the first through hole and the second through hole are dimensioned to engage an outer circumferential surface of the body of the rivet, and a head protruding from the circuit board.

2. The circuit assembly according to claim 1, including a land around an opening of the at least one second through hole is electrically connected to the head of the rivet.

3. The circuit assembly according to claim 1,
wherein the at least one first through hole includes a plurality of first through holes and the at least one second through hole includes a plurality of the second through holes, and a plurality of rivets, the plurality of rivets inserted to the plurality of first through holes and the plurality of second through holes.

4. An electrical junction box comprising:
the circuit assembly according to claim 1;
a heat sink attached to the busbar; and
a case accommodating the circuit assembly and the heat sink.

* * * * *